US007268853B2

(12) United States Patent
Ryu et al.

(10) Patent No.: US 7,268,853 B2
(45) Date of Patent: Sep. 11, 2007

(54) EXPOSING SYSTEMS PROVIDING POST EXPOSURE BAKING AND RELATED METHODS

(75) Inventors: Sung-Jae Ryu, Gyeonggi-do (KR); Sang-Kap Kim, Gyeonggi-do (KR); Young-Kyou Park, Seoul (KR); Yoon-Ho Eo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 182 days.

(21) Appl. No.: 10/984,524

(22) Filed: Nov. 9, 2004

(65) Prior Publication Data

US 2005/0200818 A1    Sep. 15, 2005

(30) Foreign Application Priority Data

Mar. 11, 2004  (KR) ............... 10-2004-0016600

(51) Int. Cl.
| G03B 27/32 | (2006.01) |
| G03B 27/42 | (2006.01) |
| G03D 5/00 | (2006.01) |

(52) U.S. Cl. ............... 355/27; 355/53; 396/611
(58) Field of Classification Search ............... 355/53, 355/27; 378/34; 396/611; 29/25.01; 118/719; 356/389; 438/478
See application file for complete search history.

(56) References Cited

U.S. PATENT DOCUMENTS 6,264,748 B1    7/2001    Kuriki et al.

(Continued)

FOREIGN PATENT DOCUMENTS

KR    2000-0065378    11/2000

(Continued)

OTHER PUBLICATIONS

A English Translation of Relevant Parts of the Novelty Dutch Search Report, Mar. 20, 2006.

(Continued)

*Primary Examiner*—W. B. Perkey
*Assistant Examiner*—Kevin Gutierrez
(74) *Attorney, Agent, or Firm*—Myers Bigel Sibley & Sajovec

(57) ABSTRACT

A system for photolithography may include an exposure chamber providing a first isolated environment, an exposure stage in the exposure chamber, a radiation source, an interface chamber providing a second isolated environment, a port, a post exposure bake heater in the interface chamber, and a wafer handler. The exposure stage may be configured to receive a wafer having photoresist thereon to be exposed, and the radiation source may be configured to provide exposing radiation to the wafer being exposed. The port may be configured to allow wafer transport between the first and second isolated environments of the exposure and interface chambers, and the post exposure bake heater may be configured to bake the wafer after exposure. The wafer handler may be configured to move the wafer from the interface chamber through the port into the exposure chamber before exposure, to move the wafer from the exposure chamber through the port to the interface chamber after exposure, and to move the wafer to the post exposure bake heater after moving the wafer from the exposure chamber. Moreover, at least one of a photoresist coating unit and/or a photoresist developing unit may be excluded from the first and second isolated environments of the exposure and interface chambers. Related methods are also discussed.

68 Claims, 3 Drawing Sheets

U.S. PATENT DOCUMENTS

| | | |
|---|---|---|
| 6,358,672 B2 | 3/2002 | Jeoung et al. |
| 6,362,116 B1 | 3/2002 | Lansford |
| 6,632,281 B2 | 10/2003 | Kitano et al. |
| 2002/0011207 A1 | 1/2002 | Uzawa et al. |

FOREIGN PATENT DOCUMENTS

| | | |
|---|---|---|
| KR | 000065378 | 11/2000 |

OTHER PUBLICATIONS

Dutch Search Report for No. 135614 Issued on Mar. 20, 2006.

EXPOSING SYSTEMS PROVIDING POST EXPOSURE BAKING AND RELATED METHODS

RELATED APPLICATION

The present application claims the benefit of and priority under 35 U.S.C. Sec. 119 to Korean Application No. 2004-16600 filed Mar. 11, 2004, the disclosure of which is hereby incorporated herein in its entirety by reference.

FIELD OF THE INVENTION

The present invention relates to the field of integrated circuit processing, and more particularly, to systems for photolithography and related methods.

BACKGROUND

As a general trend, wavelengths of light used in optical exposing systems to expose photoresist layers on integrated circuit wafers have been decreasing to provide increased resolutions. In optical exposing systems using short wavelength light, such as that generated using KrF in a fluorine excimer laser, for example, an optical exposing system may be connected in-line with a coating/developing system (CDS) used to coat wafers with photoresist and to develop the exposed photoresist on the wafers. The in-line connections may be provided to reduce degradation of photoresist resulting from exposure to ammonia. By reducing exposure to ammonia, a quality of an exposed image may be improved. Optical exposing systems are discussed, for example, in U.S. Patent Publication No. 2002/0011207 to Uzawa et al. (hereinafter "Uzawa"), the disclosure of which is hereby incorporated herein in its entirety by reference.

A CDS (coating/developing system) may include a photoresist coating unit used to coat a wafer with photoresist and a developer used to develop the exposed wafer, and an interface may be used to transport a wafer between the CDS and an exposure apparatus. The exposure apparatus may include a wafer handler used to transfer a wafer between positions therein, a pre-alignment unit used to detect a reference mark position on the wafer before exposure, a wafer stage used to support the wafer (wherein the wafer stage is driven in X, Y, Z, .theta., and tilt directions), and a manual loading/unloading port section. The pre-alignment unit pre-aligns a wafer at a predetermined temperature to reduce measurement errors that may result from expansion/contraction of the wafer.

When photolithographically patterning an integrated circuit wafer, the wafer is loaded into the CDS, and the wafer is coated with photoresist using the photoresist coating unit of the CDS. The wafer is temporarily heated to a high temperature (pre-baked) using a heating unit, and cooled using a cooling unit. The wafer passes through the interface, and is transported to the exposure apparatus. In the exposure apparatus, the wafer is pre-aligned using the pre-alignment unit, and then the wafer is set on the wafer stage. The wafer is aligned with a reticle using the wafer stage of the exposure apparatus, and the wafer is exposed to a predetermined integrated circuit image. The exposed wafer is returned to the CDS via the interface, and the wafer is heated to a relatively high temperature (referred to as a post exposure bake or PEB) using a heating/cooling unit of the CDS, cooled, and then developed using a developing unit. A time between exposing and developing processing may influence chemical changes of the photoresist. After developing the photoresist, the wafer may be heated and cooled, unloaded from the CDS, and transported for other processing operations.

Optical exposing systems are also discussed in U.S. Pat. No. 6,362,116 to Lansford, U.S. Pat. No. 6,358,672 to Jeoung et al., and Korean Publication No. 2000-0065378 to Choi et al., the disclosures of which are hereby incorporated herein in their entirety by reference.

SUMMARY

According to embodiments of the present invention, a system for photolithography may include an exposure chamber providing an isolated environment, an exposure stage in the isolated environment of the exposure chamber, a radiation source, an interface chamber outside the isolated environment of the exposure chamber, a port allowing wafer transport between the isolated environment of the exposure chamber and the interface chamber, a post exposure bake heater, and a wafer handler. The exposure stage may be provided in the isolated environment of the exposure chamber, and the exposure stage may be configured to receive a wafer having photoresist thereon to be exposed. The radiation source may be configured to provide radiation to the wafer being exposed, and the post exposure bake heater may be provided in the interface chamber to bake the wafer after exposure. Moreover, the wafer handler may be configured to remove the wafer having photoresist thereon from a cassette holding a plurality of wafers having photoresist thereon, and to move the wafer having photoresist thereon through the port to the isolated environment of the exposure chamber before exposure. The wafer handler may be further configured to remove the wafer through the port from the isolated environment of the exposure chamber after exposure, to move the wafer to the post exposure bake heater after removing the wafer from the exposure chamber, and to move the wafer to the cassette or a different cassette after baking the wafer without developing the photoresist on the wafer.

More particularly, the wafer handler may be configured to return the wafer to the cassette from which the wafer was removed after baking the wafer without developing the photoresist on the wafer. In an alternative, the wafer handler may be configured to move the wafer to the different cassette after baking the wafer without developing the photoresist on the wafer.

In addition, the interface chamber may provide a second isolated environment separate from the first isolated environment of the exposure chamber with the port allowing wafer transport between the first and second isolated environments, wherein the post exposure bake heater is in the second isolated environment of the interface chamber. A photoresist coating unit and a photoresist developing unit may be outside the first and second isolated environments of the exposure and interface chambers. In addition, the first isolated environment of the exposure chamber may be configured to receive air from a first source, the second isolated environment of the interface chamber may be configured to receive air from a second source, and the first and second sources may be different. Moreover, the first source may include a first filter not included in the second source.

The system may also include a photoresist coating unit configured to coat a layer of photoresist on the wafer and to load the wafer in the cassette holding the plurality of wafers having photoresist thereon before removing the wafer from the cassette at the wafer handler. In addition, a photoresist developing unit may be configured to develop exposed photoresist on the wafer after moving the wafer to the cassette or to the different cassette.

The port may also include a load/lock mechanism to maintain isolation of the isolated environment of the exposure chamber when transporting the wafer between the isolated environment of the exposure chamber and the interface chamber. In addition, the port may include a first port allowing transport of the wafer from the interface chamber to the isolated environment of the exposure chamber and a second port allowing transport of the wafer from the isolated environment of the exposure chamber to the interface chamber.

Moreover, the wafer may be individually processed between removing the wafer from the cassette and moving the wafer to the cassette or the different cassette to provide in-line processing through exposure and post exposure baking. Accordingly, the wafer handler may provide in-line wafer handling. In addition, a cooler may be configured to cool the wafer after baking wherein the wafer handler is further configured to move the wafer to the cooler after baking and to move the wafer to the cassette or the different cassette after cooling.

According to additional embodiments of the present invention, a system for photolithography may include an exposure chamber providing an isolated environment, an exposure stage in the isolated environment of the exposure chamber, a radiation source, a port allowing wafer transport into and out of the isolated environment of the exposure chamber, a post exposure bake heater, a photoresist developing unit, and a wafer handler. The exposure stage may be configured to receive a wafer having photoresist thereon to be exposed, and the radiation source may be configured to provide exposing radiation to the wafer being exposed. The post exposure bake heater may be configured to bake the wafer after exposure, and the photoresist developing unit may be configured to dispense a developer on the wafer after exposing and baking. The wafer handler may be configured to remove the wafer having photoresist thereon from a cassette holding a plurality of wafers having photoresist thereon, and to move the wafer through the port to the isolated environment of the exposure chamber after removing the wafer from the cassette. The wafer handler may be further configured to remove the wafer through the port from the isolated environment of the exposure chamber after exposure, to move the wafer to the post exposure bake heater after removing the wafer from the exposure chamber, and to move the wafer to the developing station so that the developer is dispensed on the wafer after baking.

More particularly, the wafer handler may be configured to place the wafer in the cassette from which the wafer was removed after dispensing developer on the wafer. In an alternative, the wafer handler may be configured to place the wafer in a different cassette other than the cassette from which the wafer was removed after dispensing developer on the wafer.

The system may also include an interface chamber outside the first isolated environment of the exposure chamber, and the interface chamber may provide a second isolated environment separate from the first isolated environment with the port allowing wafer transport between the first and second isolated environments. In addition, the post exposure bake heater may be in the second isolated environment of the interface chamber. The photoresist developing unit may be in the second isolated environment of the interface chamber, or the photoresist developing unit may be outside the second isolated environment of the interface chamber. In addition, a photoresist coating unit may be outside the first and second isolated environments. Moreover, the first isolated environment may be configured to receive air from a first source, the second isolated environment is configured to receive air from a second source, and the first and second sources are different. More particularly, the first source may include a filter not used in the second source.

In addition, a photoresist coating unit may be configured to coat a layer of photoresist on the wafer and to load the wafer in the cassette holding the plurality of wafers having photoresist thereon before removing the wafer from the cassette at the wafer handler. Moreover, the port may include a load/lock mechanism to maintain isolation of the isolated environment of the exposure chamber when transporting the wafer into and out of the isolated environment of the exposure chamber. The port may also include a first port allowing transport of the wafer into the isolated environment of the exposure chamber and a second port allow transport of the wafer out of the isolated environment of the exposure chamber.

The wafer may be individually processed from removing the wafer from the cassette until after dispensing developer on the wafer to provide in-line processing through exposure, post exposure baking, and developing. Accordingly, the wafer handler may provide in-line wafer handling. In addition, a cooler may be configured to cool the wafer after baking, and the wafer handler may be further configured to move the wafer to the cooler after baking and to move the wafer to the developing station after cooling.

According to still additional embodiments of the present invention, a system for photolithography may include a photoresist coating unit configured to dispense photoresist on a wafer, an exposure chamber providing an isolated environment, an exposure stage in the isolated environment of the exposure chamber, a radiation source, a port allowing wafer transport into and out of the isolated environment of the exposure chamber, an exposure bake heater, and a wafer handler. The exposure stage may be configured to receive the wafer having photoresist thereon to be exposed, the radiation source may be configured to provide exposing radiation to the wafer being exposed, and the post exposure bake heater may be configured to bake the wafer after exposure. The wafer handler may be configured to move the wafer to the photoresist coating unit, to move the wafer through the port to the isolated environment of the exposure chamber after dispensing photoresist thereon, and to remove the wafer from the isolated environment of the exposure chamber through the port after exposure. The wafer handler may be further configured to move the wafer to the post exposure bake heater after removing the wafer from the exposure chamber, and to move the wafer to a cassette holding a plurality of wafers after baking without developing.

The wafer handler may be further configured to remove the wafer from a cassette holding a plurality of wafers before moving the wafer to the photoresist coating unit wherein the wafer is removed from and moved to the same cassette. In an alternative, the wafer handler may be further configured to remove the wafer from a cassette holding a plurality of wafers before moving the wafer to the photoresist coating unit wherein the wafer is removed from and moved to different cassettes.

An interface chamber may also be provided outside the first isolated environment of the exposure chamber, and the interface chamber may provide a second isolated environment separate from the first isolated environment with the port allowing wafer transport between the first and second isolated environments. Moreover, the post exposure bake heater may be provided in the second isolated environment of the interface chamber. In addition, the photoresist coating unit may be provided in the second isolated environment of the interface chamber. In an alternative, the photoresist coating unit may be outside the first and second isolated environments. A photoresist developing unit is outside the first and second isolated environments. The first isolated environment may be configured to receive air from a first source, the second isolated environment may be configured to receive air from a second source, and the first and second sources may be different. More particularly, the first source may include a filter not included in the second source.

Moreover, the port may include a load/lock mechanism to maintain isolation of the isolated environment of the exposure chamber when transporting the wafer into and out of the isolated environment of the exposure chamber. The port may include a first port allowing transport of the wafer into the isolated environment of the exposure chamber and a second port allowing transport of the wafer out of the isolated environment of the exposure chamber. In addition, the wafer may be individually processed from moving the wafer to the photoresist coating unit until moving the wafer to the cassette to provide in-line processing through coating, exposure, and post exposure baking. Accordingly, the wafer handler may provide in-line wafer handling. A cooler may also be provided with the cooler being configured to cool the wafer after post exposure baking with the wafer handler being further configured to move the wafer to the cooler after post exposure baking and to move the wafer to the cassette after cooling. The system may also include a photoresist developing unit configured to dispense a developer on the wafer after moving the wafer to the cassette.

According to yet additional embodiments of the present invention, a system for photolithography may include an exposure chamber providing a first isolated environment, an exposure stage in the exposure chamber, a radiation source, an interface chamber providing a second isolated environment, a port allowing wafer transport between the first and second isolated environments of the exposure and interface chambers, a post exposure bake heater in the interface chamber, and a wafer handler. The exposure stage may be configured to receive a wafer having photoresist thereon to be exposed, the radiation source may be configured to provide exposing radiation to the wafer being exposed, and the post exposure bake heater may be configured to bake the wafer after exposure. The wafer handler may be configured move the wafer from the interface chamber through the port into the exposure chamber before exposure, to remove the wafer from the exposure chamber through the port to the interface chamber after exposure, and to move the wafer to the post exposure bake heater after removing the wafer from the exposure chamber. Moreover, at least one of a photoresist coating unit and/or a photoresist developing unit may be excluded from the first and second isolated environments of the exposure and interface chambers.

In addition, a photoresist coating unit may be configured to coat a layer of photoresist on the wafer and to load the wafer in a cassette holding a plurality of wafers having photoresist thereon, the photoresist coating unit may be outside the first and second isolated environments of the exposure and interface chambers, and the wafer handler may be further configured to remove the wafer having photoresist thereof from the cassette before moving the wafer into the exposure chamber. The wafer handler may be further configured to move the wafer to a cassette holding a plurality of wafers after post exposure baking, with the system further including a photoresist developing unit configured to dispense developer on the wafer after moving the wafer to the cassette wherein the photoresist developing unit is outside the first and second isolated environments of the exposure and interface chambers.

The wafer handler may be further configured to remove the wafer having photoresist thereon from a cassette holding a plurality of wafers having photoresist thereon before moving the wafer to the exposure chamber. In addition or in an alternative, the wafer handler may be configured to move the wafer to a cassette after post exposure baking without developing. The isolated environment of the exposure chamber may also be configured to receive air from a first source, the isolated environment of the interface chamber may be configured to receive air from a second source, and the first and second sources may be different. In addition, the first source may include a first filter not included in the second source.

The port may includes a load/lock mechanism to maintain isolation of the first and second isolated environments of the exposure and interface chambers when transporting the wafer between the first and second isolated environments. Moreover, the port may include a first port allowing transport of the wafer from the interface chamber to the exposure chamber and a second port allowing transport of the wafer from the exposure chamber to the interface chamber. In addition, the wafer may be individually processed to provide in-line processing through exposure and post exposure baking. Accordingly, the wafer handler may provide in-line wafer handling.

DETAILED DESCRIPTION

Figure 1:
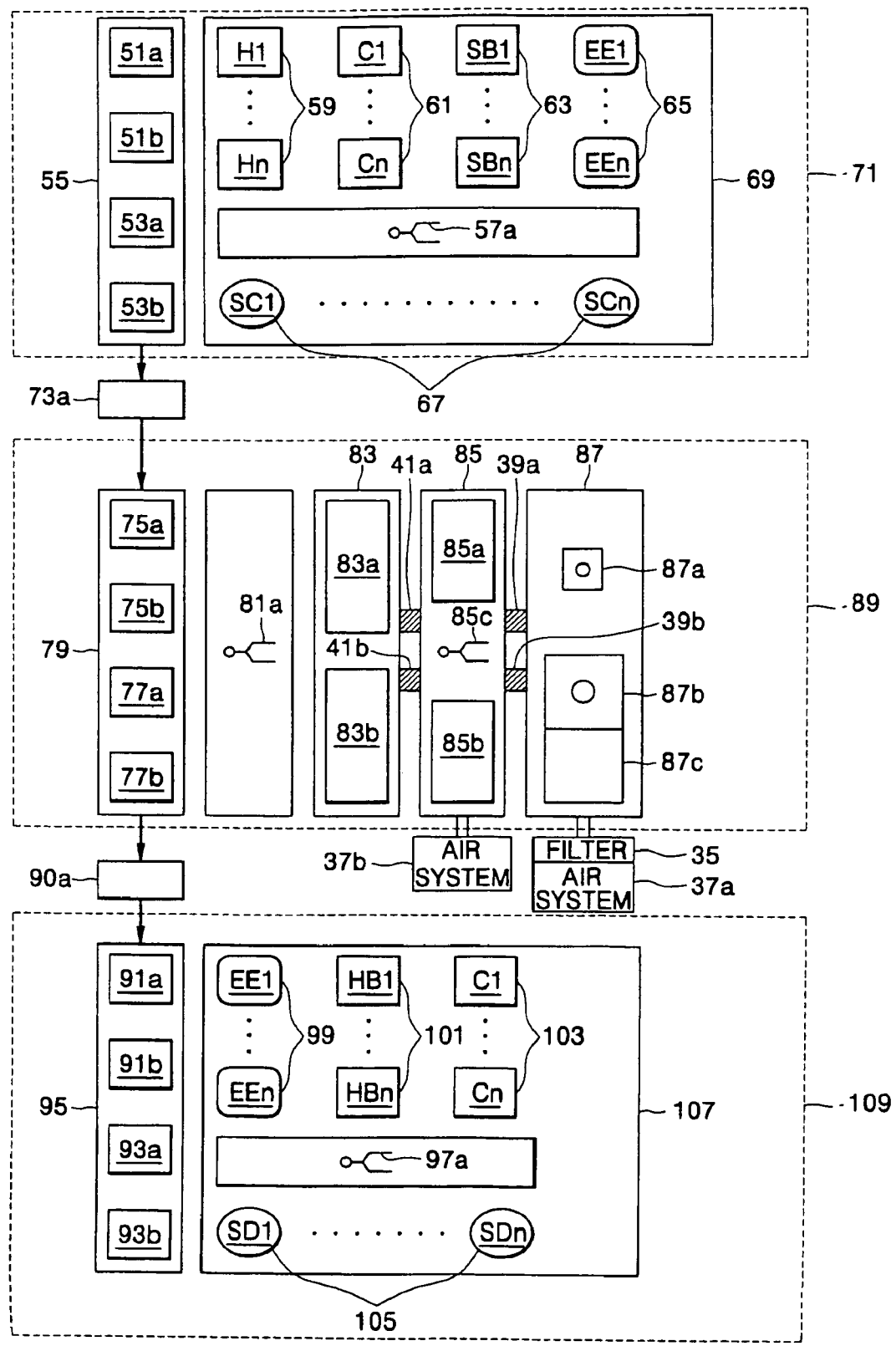
FIG. 1 is a block diagram illustrating photoresist coating systems, optical exposing systems, and photoresist developing systems for photolithography according to first embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating photoresist coating systems, optical exposing systems, and photoresist developing systems according to first embodiments of the present invention. As shown in FIG. 1, an optical exposing system 89 may include an exposure chamber 87 providing a first isolated environment; an interface chamber 85 providing a second isolated environment; a staging chamber 83; and a wafer handler that may include one or more robots 81a and/or 85c, and/or wafer cassette loading/unloading station 79. As further shown in FIG. 1, a photoresist coating system 71 and a developing system 109 may be provided separate from the optical exposing system 89 with pluralities of wafers being transported from the photoresist coating system 71 to the optical exposing system 89 and from the optical exposing system 89 to the developing system 109 in wafer cassettes. As will be understood by those having skill in the art, a wafer cassette is a container configured to hold as many as 25 or more wafers in a configuration adapted for loading and unloading wafers using loading/unloading stations 55, 79, and/or 95 without damaging the wafers. Moreover, cassettes of wafers may be transported from the photoresist coating system 71 to the optical exposing system 89 and from the optical exposing system 89 to the developing system 109, for example, manually, using automated guided vehicles (AGVs), using over head transport, and/or other techniques known to those having skill in the art.

The photoresist coating system 71 is configured to coat a layer of photoresist on each wafer processed thereby and to load a plurality of wafers having photoresist thereon in a respective wafer cassette for transport to the optical exposing system 89. More particularly, the coating system 71 may include a wafer cassette loading/unloading station 55 and a coating track 69. The wafer cassette loading/unloading station 55 may include a plurality of wafer unloading stations 51a-b and a plurality of wafer cassette loading stations 53a-b. The coating track 69 may include one or a plurality of spin coating units 67, one or a plurality of wafer handling robots 57a, one or a plurality of soft baking units 63 (such as a heating plate or plates), one or a plurality of adhesive coating units 59, one or a plurality of cooling units 61 (such as a cooling plate or plates), and/or one or a plurality of edge exposure units 65. In an alternative, edge exposure units may be omitted from the coating system and instead provided in the developing system.

Accordingly, a wafer cassette holding a plurality of wafers may be provided at one of the wafer unloading stations 51a-b, and the wafers in the cassette may be individually unloaded for photoresist coating on the coating track 69. Each individual wafer, for example, may be processed through an adhesive coating unit 59 to dispense an adhesive such as hexamethyldisilazane (HMDS) thereon to improve adhesion of a subsequently applied photoresist layer. The adhesive coating unit 59 may apply the adhesive by spinning the wafer while dispending a liquid adhesive thereon. After applying the adhesive, the wafer may be transferred to a cooling unit 63 (such as a cooling plate) and then to a photoresist spin coating unit 67 configured to dispense photoresist thereon by spinning the wafer while dispensing liquid photoresist thereon. After dispensing photoresist, the wafer may be transferred to a soft baking unit 63 (such as a baking plate) to remove solvents and thereby harden the photoresist by heating at a temperature in the range of approximately 100 degrees C. to approximately 110 degrees C. After soft baking, the wafer may be transferred to a cooling unit 61, and then to an edge exposure unit 65 to selectively expose portions of the hardened photoresist at edge portions of the wafer to radiation. After edge exposure, the wafer may be transferred to a wafer cassette at one of the loading stations 53a-b for transport to the optical exposing system 89.

A wafer handler of the photoresist coating system 71 may be configured to transfer each wafer from a cassette at an unloading station 51a-b to the coating track 69, between different elements of the coating track 69, and then to a wafer cassette at a loading station 53a-b. In an alternative, a wafer may be returned to the same cassette from which it was removed. As shown by way of example in FIG. 1, a wafer handler of the photoresist coating system 71 may include a robot 57a. In addition, belts may be provided at wafer unloading and/or loading stations 51a-b and/or 53a-b to unload wafers from and/or load wafers into wafer cassettes. Moreover, a wafer handler may include a plurality of robots and/or alternate transfer mechanisms.

In addition, the operations of adhesive coating, cooling, photoresist spin coating, soft baking, cooling, and edge exposure may be performed in-line such that each wafer is processed individually between unloading from a cassette at an unloading station and loading into a cassette at a loading station. As discussed above, wafer cassette transfer from the photoresist coating unit 71 to the optical exposing system 89 may be performed at block 73a, for example, manually, using AGVs, using overhead transport, etc. Accordingly, the photoresist coating system 71 may be operated in a stand-alone manner with respect to the optical exposing system 89 of FIG. 1.

The optical exposing system 89 is configured to expose wafers having photoresist thereon to an image projected thereon using electromagnetic radiation (such as light). More particularly, a pattern may be defined by opaque and transparent portions of a mask, and the pattern of the mask may be projected onto a wafer by projecting electromagnetic radiation through the mask to the wafer.

A wafer handler of the optical exposing system 89 may be configured to unload wafers having photoresist thereon from a wafer cassette at one of a plurality of unloading stations 75a-b prior to exposure and to load wafers into a wafer cassette at a loading station 77a-b after exposure. Moreover, the wafer handler of the optical exposing system may be configured to transfer wafers between different elements of the optical exposing system 89. The wafer handler of the optical exposing system may include one or a plurality of robots such as robots 81a and 85c and/or alternate transfer mechanisms. In addition, belts may be provided at wafer unloading and/or loading stations 75a-b and/or 77a-b to unload wafers from and/or load wafers into wafer cassettes.

As shown in FIG. 1, a staging chamber 83 may include an input stage 83a and an output stage 83b; an interface chamber 85 may include a post exposure bake heater 85a (such as a baking plate) and a cooler 85b (such as a cooling plate); and an exposure chamber 87 may include a pre-alignment stage 87a, an exposure stage 87b, and a radiation projector 87c including a source of radiation (such as electromagnetic radiation) and a lens configured to focus exposing radiation from the source of radiation to a wafer on the exposure stage. In addition, the exposure chamber 87 may provide a first isolated environment including the pre-alignment stage 87a and the exposure stage 87b therein, and the interface chamber 85 may provide a second isolated environment including the post exposure bake heater 85a and the cooler 85b therein.

Moreover, separate air control systems 37a-b may be used to maintain desired conditions within the isolated environments of the exposure chamber 87 and the interface chamber 85. For example, the air control systems 37a-b may provide clean dry air to the respective chambers. In addition, the air control system 37a for the exposure chamber 87 may include a chemical filter 35 not used for the air supply to interface chamber 85. By providing the post exposure bake heater 85a outside the isolated environment of the exposure chamber 87, a lens and/or other optics of the radiation projector 87c may be protected from solvents and/or other contaminants that may be generated during post exposure baking. In addition, a lens and/or other optics of the radiation projector 87c may be insulated from heat generated by post exposure baking.

Exposure chamber input port 39a allows wafer transport from the second isolated environment of the interface chamber 85 to the first isolated environment of the exposure chamber 87. Exposure chamber output port 39b allows wafer transport from the first isolated environment of the exposure chamber 87 to the second isolated environment of the interface chamber 85. Moreover, the input and output ports 39a-b may include respective load/lock mechanisms to maintain isolation of the respective isolated environments of the interface and exposure chambers 85 and 87 when transferring wafers therebetween. The input and output ports 39a-b may also provide isolation of a wafer from an external environment during transport between the interface and exposure chambers 85 and 87.

By providing an in-line coupling(s) between the exposure stage 87b in the exposure chamber 87 and the post exposure bake heater 85a in the interface chamber 85, a time between exposure and post exposure bake for a wafer can be reduced thereby improving pattern uniformity. In addition, by providing isolated environments in the exposure and interface chambers 87 and 85, exposure to damaging chemicals such as ammonia may be reduced between exposure and post exposure bake. After post exposure bake, an exposed photoresist layer may be less susceptible to damage resulting from exposure to chemicals such as ammonia.

Interface chamber input port 41a allows wafer transport from the input stage 83a to the isolated environment of the interface chamber 85. Interface chamber output port 41b allows wafer transport from isolated environment of the interface chamber 85 to the output stage 83b. Moreover, the input and output ports 41a-b may include respective load/lock mechanisms to maintain isolation of the isolated environment of the interface chamber 85 when transferring wafers to and from the staging chamber 83. In an alternative, the input and output stages 83a-b may be included in the isolated environment of the interface chamber 85.

A cassette of wafers having photoresist thereon may thus be provided on one of the loading stations 75a-b, and a wafer handler of the optical exposing system 89 may transport wafers from the cassette at the loading station for individual in-line processing through exposure and post exposure bake and then to another cassette at one of the unloading stations 77a-b. In an alternative, wafers may be returned to a same cassette from which they were removed after exposure and post exposure baking.

A wafer handler including robots 81a and 85c may remove a wafer having photoresist thereon from the cassette at the loading station, and transfer the wafer to the input stage 83a. The wafer handler may then transfer the wafer through input port 41a into the interface chamber 85 and then through input port 39a to a pre-alignment stage 87a in the exposure chamber 87. The pre-alignment stage 87a may provide physical alignment of the wafer before transferring the wafer to the exposure stage 87b. At the exposure stage 87b, the photoresist layer on the wafer is exposed to electromagnetic radiation generated by the radiation projector 87c. Exposure operations are also discussed, for example, in U.S. Patent Publication No. 2002/0011207, the disclosure of which is hereby incorporated herein in its entirety by reference.

After exposure, the wafer handler may transfer the wafer from the exposure stage 87b through the output port 39b to the post exposure bake heater 85a in the interface chamber 85. More particularly, the post exposure bake heater 85a may be configured to heat the wafer and photoresist thereon to a temperature in the range of approximately 100 degrees C. to approximately 110 degrees C. By heating the exposed photoresist, an interface profile between the exposed and non-exposed regions of the photoresist layer may be improved by more uniformly diffusing acid in exposed regions. The post exposure baking may also reduce subsequent damage to the exposed photoresist layer resulting from exposure to ammonia.

After post exposure baking, the wafer handler may transfer the wafer to the cooler 85b for cooling. After cooling, the wafer handler may transfer the wafer from the cooler 85b, through the output port 41b to the output stage 83b. From the output stage 83b, the wafer may be transferred to a cassette on one of the loading stations 77a-b.

The operations of pre-alignment, exposure, post exposure baking, and cooling may be performed in-line such that each wafer is processed individually between unloading from a cassette at an unloading station 75a-b and loading into a cassette at a loading station 77a-b. Wafer cassette transfer from the optical exposing system 89 to the photoresist developing system 109 may be performed at block 90a, for example, manually, using AGVs, using overhead transport, etc. Accordingly, the photoresist developing system 109 may be operated in a stand-alone manner with respect to the optical exposing system 89 of FIG. 1.

By providing an in-line coupling between the exposure stage 87b and the post exposure bake heater 85a, a time between exposure and post exposure baking can be reduced. By providing protection from an external environment in the exposure chamber 87, in the output port 39b, and in the interface chamber 85 during and between exposure and post exposure baking, deterioration due to exposure to agents such as ammonia can be reduced.

The photoresist developing system 109 is configured to receive a wafer cassette including a plurality of wafers having photoresist thereon previously exposed by the optical exposing system 89 discussed above. Each of the wafers in the cassette may be processed by the photoresist developing system 109 to develop the previously exposed photoresist layers thereon. More particularly, the photoresist developing system 89 may include a wafer cassette loading/unloading station 95 and a developing track 107. The wafer cassette loading/unloading station 95 may include a plurality of wafer unloading stations 91a-b and a plurality of wafer cassette loading stations 93a-b. The developing track 107 may include one or a plurality of spin developing units 105, one or a plurality of wafer handling robots 97a, one or a plurality of hard baking units 101, one or a plurality of cooling units 103, and/or one or a plurality of edge exposure units 99. As shown in FIG. 1, each of the photoresist coating system 71 and the photoresist developing system 109 includes an edge exposure unit 65 and 99. As will be understood, however, an edge exposure unit may be provided in one of the coating or developing systems and omitted in the other.

Accordingly, a wafer cassette holding a plurality of wafers may be provided at one of the wafer unloading stations 95a-b, and the wafers in the cassette may be individually unloaded for photoresist developing on the developing track 107. If edge exposure has not been previously performed, a wafer may be unloaded from a cassette and transferred to an edge exposure unit 99 to selectively expose portions of the photoresist at edge portions of the wafer to radiation. After edge exposure, the wafer may be transferred to a spin developing unit 105 configured to dispense developer thereon by spinning the wafer while dispensing liquid developer thereon. If edge exposure was performed at the photoresist coating system 71, the wafer may be transferred directly to a spin developing unit 105. By dispensing the developer on the previously exposed photoresist, exposed portions of the photoresist on the wafer may be removed while unexposed portions of the photoresist may be maintained on the wafer. (In an alternative, the developer may remove unexposed portions of the photoresist while maintaining previously exposed portions of the photoresist.)

After applying the developer, the wafer may be transferred to a hard baking unit 101 to harden the developed (i.e. patterned) photoresist layer by heating, and then to a cooling unit 103. After cooling, the wafer may be transferred to a wafer cassette at one of the loading stations 93a-b for transport to a subsequent processing system such as an etch station (wet and/or dry), an ion implanter, etc. In an alternative, a wafer may be returned to the same cassette from which it was removed.

As shown by way of example in FIG. 1, a wafer handler of the photoresist developing system 109 may include a robot 97a. In addition, belts may be provided at wafer unloading and/or loading stations 91a-b and/or 93a-b to unload wafers from and/or load wafers into wafer cassettes. Moreover, a wafer handler may include a plurality of robots and/or alternate transfer mechanisms.

In addition, the operations of edge exposure, dispensing developer, hard baking, and cooling may be performed in-line such that each wafer is processed individually between unloading from a cassette at an unloading station and loading into a cassette at a loading station. As discussed above, wafer cassette transfer from the optical exposing system 89 to the photoresist developing system 109 may be performed at block 90a, for example, manually, using AGVs, using overhead transport, etc. Accordingly, the photoresist developing system 109 may be operated in a stand-alone manner with respect to the optical exposing system 89 of FIG. 1.

By providing an in-line coupling between the exposure stage 87b and the post exposure bake heater 85a, a time between exposure and post exposure bake can be reduced thereby reducing deterioration of the exposed photoresist. After baking, the photoresist is less susceptible to deterioration. Deterioration can be further reduced by providing that the photoresist is isolated from an outside environment during and between exposure and post exposure baking. By maintaining the post exposure bake heater outside an isolated environment including the radiation projector 87c, the contamination of the radiation projector optics (due to solvents released during post exposure bake) can be reduced, and thermal expansion of the radiation projector optics can be reduced.

In addition, by providing that the photoresist coating system 71 and the photoresist developing system 109 operate in a stand alone manner with respect to the optical projection system, a break down of one system does not force a shut down of either of the other systems. Moreover, a speed of one of the systems does not dictate a speed of the other system or systems. For example, if the optical exposing system 89 can process wafers at twice the rate of the photoresist coating system 71, two photoresist coating systems may be used to provide that the optical exposing system 89 may operate at full capacity. Similarly, if the optical exposing system 89 can process wafers at twice the rate of the photoresist developing system 109, two photoresist developing systems may be used to provide that the optical exposing system 89 may operate at full capacity.

Figure 2:
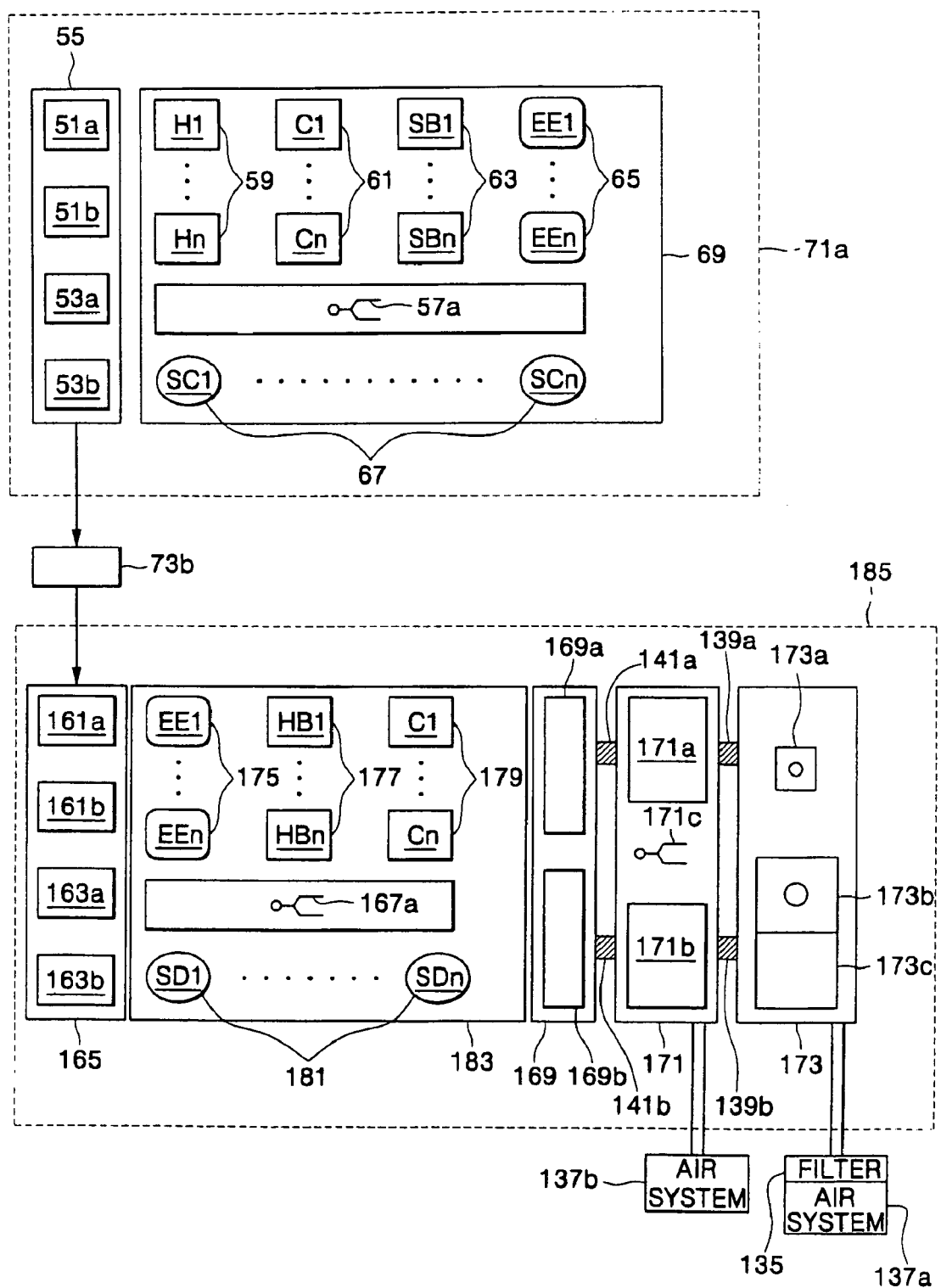
FIG. 2 is a block diagram illustrating coating/exposing systems and photoresist developing systems for photolithography according to second embodiments of the present invention.

FIG. 2 is a block diagram illustrating photoresist coating systems and exposing/developing systems according to second embodiments of the present invention. As shown in FIG. 2, a combined exposing/developing system 185 may include an exposure chamber 173 providing a first isolated environment; an interface chamber 171 providing a second isolated environment; a staging chamber 169; a developing track; and a wafer handler that may include one or more robots 167a and/or 171c, and/or wafer cassette loading/unloading station 165. As further shown in FIG. 2, a photoresist coating system 71a may be provided separate from the combined exposing/developing system 89 with pluralities of wafers being transported from the photoresist coating system 71a to the combined exposing/developing system 185 in wafer cassettes. As will be understood by those having skill in the art, a wafer cassette is a container configured to hold as many as 25 or more wafers in a configuration adapted for loading and unloading wafers using loading/unloading stations 55 and 165 without damaging the wafers. Moreover, cassettes of wafers may be transported from the photoresist coating system 71a to the combined exposing/developing system 185, for example, manually, using automated guided vehicles (AGVs), using over head transport, and/or other techniques known to those having skill in the art. The photoresist coating system 71a and elements thereof function as discussed above with regard to the photoresist coating system 71 of FIG. 1, and discussion thereof will not be repeated.

The combined exposing/developing system 185 is configured to expose wafers having photoresist thereon to an image projected thereon using electromagnetic radiation (such as light) and then develop the exposed photoresist. More particularly, a pattern may be defined by opaque and transparent portions of a mask, and the pattern of the mask may be projected onto a wafer by projecting electromagnetic radiation through the mask to the wafer. The exposed photoresist may then be developed by dispensing a developer thereon.

A wafer handler of the combined exposing/developing system 185 may be configured to unload wafers having photoresist thereon from a wafer cassette at one of a plurality of unloading stations 161a-b prior to exposing and developing the photoresist and to load wafers into a wafer cassette at a loading station 163a-b after exposing and developing the photoresist. Moreover, the wafer handler of the combined exposing/developing system 185 may be configured to transfer wafers between different elements of the combined exposing/developing system 185. The wafer handler of the combined exposing/developing system 185 may include one or a plurality of robots such as robots 167a and 171c and/or alternate transfer mechanisms. In addition, belts may be provided at wafer unloading and/or loading stations 161a-b and/or 163a-b to unload wafers from and/or load wafers into wafer cassettes.

As shown in FIG. 2, a developing track 183 may include one or a plurality of edge exposure units 175, one or a plurality of spin developing units 181, one or a plurality of hard baking units 177, and/or one or a plurality of cooling units 179. In addition, a staging chamber 169 may include an input stage 169a and an output stage 169b; an interface chamber 171 may include a post exposure bake heater 171a (such as a baking plate) and a cooler 171b (such as a cooling plate); and an exposure chamber 173 may include a pre-alignment stage 173a, an exposure stage 173b, and a radiation projector 173c including a source of radiation (such as electromagnetic radiation) and a lens configured to focus exposing radiation from the source of radiation to a wafer on the exposure stage. In addition, the exposure chamber 173 may provide a first isolated environment including the pre-alignment stage 173a and the exposure stage 173b therein, and the interface chamber 171 may provide a second isolated environment including the post exposure bake heater 171a and the cooler 171b therein.

Moreover, separate air control systems 137a-b may be used to maintain desired conditions within the isolated environments of the exposure chamber 173 and the interface chamber 171. For example, the air control systems 137a-b may provide clean dry air to the respective chambers. In addition, the air control system 137a for the exposure chamber 173 may include a chemical filter 135 not used for the air supply to interface chamber 171. By providing the post exposure bake heater 171a outside the isolated environment of the exposure chamber 173, a lens and/or other optics of the radiation projector 173c may be protected from solvents and/or other contaminants that may be generated during post exposure baking. In addition, a lens and/or other optics of the radiation projector 173c may be insulated from heat generated by post exposure baking.

Exposure chamber input port 139a allows wafer transport from the second isolated environment of the interface chamber 171 to the first isolated environment of the exposure chamber 173. Exposure chamber output port 139b allows wafer transport from the first isolated environment of the exposure chamber 173 to the second isolated environment of the interface chamber 171. Moreover, the input and output ports 139a-b may include respective load/lock mechanisms to maintain isolation of the respective isolated environments of the interface and exposure chambers 171 and 173 when transferring wafers therebetween. The input and output ports 139a-b may also provide isolation of a wafer from an external environment during transport between the interface and exposure chambers 171 and 173.

By providing an in-line coupling(s) between the exposure stage 173b in the exposure chamber 173 and the post exposure bake heater 171a in the interface chamber 171, a time between exposure and post exposure bake for a wafer can be reduced thereby improving pattern uniformity. In addition, by providing isolated environments in the exposure and interface chambers 173 and 171, exposure to damaging chemicals such as ammonia may be reduced between exposure and post exposure bake. After post exposure bake, an exposed photoresist layer may be less susceptible to damage resulting from exposure to chemicals such as ammonia.

Interface chamber input port 141a allows wafer transport from the input stage 169a to the isolated environment of the interface chamber 171. Interface chamber output port 141b allows wafer transport from isolated environment of the interface chamber 171 to the output stage 169b. Moreover, the input and output ports 141a-b may include respective load/lock mechanisms to maintain isolation of the isolated environment of the interface chamber 171 when transferring wafers to and from the staging chamber 169. In an alternative, the input and output stages 169a-b may be included in the isolated environment of the interface chamber 171.

A cassette of wafers having photoresist thereon may thus be provided on one of the loading stations 161a-b, and a wafer handler of the combined exposing/developing system 185 may transport wafers from the cassette at the loading station for individual in-line processing through exposure, post exposure bake, and developing, and then to another cassette at one of the unloading stations 163a-b. In an alternative, wafers may be returned to a same cassette from which they were removed after exposure, post exposure baking, and developing.

A wafer handler including robots 167a and 171c may remove a wafer having photoresist thereon from the cassette at the loading station, and transfer the wafer through the developing track 183 to the input stage 169a. The wafer handler may then transfer the wafer through input port 141a into the interface chamber 171 and then through input port 139a to a pre-alignment stage 173a in the exposure chamber 173. The pre-alignment stage 173a may provide physical alignment of the wafer before transferring the wafer to the exposure stage 173b. At the exposure stage 173b, the photoresist layer on the wafer is exposed to electromagnetic radiation generated by the radiation projector 173c. Exposure operations are also discussed, for example, in U.S. Patent Publication No. 2002/0011207, the disclosure of which is hereby incorporated herein in its entirety by reference.

After exposure, the wafer handler may transfer the wafer from the exposure stage 173b through the output port 139b to the post exposure bake heater 171a in the interface chamber 171. More particularly, the post exposure bake heater 171a may be configured to heat the wafer and photoresist thereon to a temperature in the range of approximately 100 degrees C. to approximately 110 degrees C. By heating the exposed photoresist, an interface profile between the exposed and non-exposed regions of the photoresist layer may be improved by more uniformly diffusing acid in exposed regions. The post exposure baking may also reduce subsequent damage to the exposed photoresist layer resulting from exposure to ammonia.

After post exposure baking, the wafer handler may transfer the wafer to the cooling unit 171b for cooling. After cooling, the wafer handler may transfer the wafer from the cooling unit 171b, through the output port 141b to the output stage 169b. From the output stage 169b, the wafer may be transferred to the developing track 183. As discussed above, the developing track 183 may include one or a plurality of spin developing units 181, one or a plurality of wafer handling robots 167a, one or a plurality of hard baking units 177, one or a plurality of cooling units 179, and/or one or a plurality of edge exposure units 175. As shown in FIG. 2, each of the photoresist coating system 71a and the photoresist developing track 183 includes an edge exposure unit 65 and 175. As will be understood, however, an edge exposure unit may be provided in one of the coating system or the developing track and omitted in the other.

Once photoresist on a wafer has been exposed at exposure stage 173b and subjected to post exposure baking at post exposure heater 171a, the wafer may be subjected to edge exposure at an edge exposure unit 175 of the developing track 183 if edge exposure has not been previously performed. After edge exposure, the wafer may be transferred to a spin developing unit 181 configured to dispense developer thereon by spinning the wafer while dispensing liquid developer thereon. If edge exposure was performed at the photoresist coating system 71, the wafer may be transferred directly to a spin developing unit 181. By dispensing the developer on the previously exposed photoresist, exposed portions of the photoresist on the wafer may be removed while unexposed portions of the photoresist may be maintained on the wafer. (In an alternative, the developer may remove unexposed portions of the photoresist while maintaining previously exposed portions of the photoresist.)

After applying the developer, the wafer may be transferred to a hard baking unit 177 to harden the developed (i.e. patterned) photoresist layer by heating, and then to a cooling unit 179. After cooling, the wafer may be transferred to a wafer cassette at one of the loading stations 163a-b for transport to a subsequent processing system such as an etch station (wet and/or dry), an ion implanter, etc. In an alternative, a wafer may be returned to the same cassette from which it was removed.

As shown by way of example in FIG. 2, a wafer handler of the combined exposing/developing system 185 may include robots 167a and 171c. In addition, belts may be provided at wafer unloading and/or loading stations 161a-b and/or 163a-b to unload wafers from and/or load wafers into wafer cassettes. Moreover, a wafer handler may include a fewer or more robots and/or alternate transfer mechanisms.

In addition, the operations of exposure, post exposure baking, and dispensing developer may be performed in-line such that each wafer is processed individually between unloading from a cassette at an unloading station 161a-b and loading into a cassette at a loading station 163a-b. As discussed above, wafer cassette transfer from the photoresist coating system 71a to the exposing/developing system 185 may be performed at block 73b, for example, manually, using AGVs, using overhead transport, etc. Accordingly, the photoresist coating system 71a may be operated in a stand-alone manner with respect to the exposing/developing system 185 of FIG. 2.

By providing an in-line coupling between the exposure stage 173b and the post exposure bake heater 171a, a time between exposure and post exposure bake can be reduced thereby reducing deterioration of the exposed photoresist. After baking, the photoresist is less susceptible to deterioration. Deterioration can be further reduced by providing that the photoresist is isolated from an outside environment during and between exposure and post exposure baking. By maintaining the post exposure bake heater outside an isolated environment including the radiation projector 173c, contamination of the radiation projector optics (due to solvents released during post exposure bake) can be reduced, and thermal expansion of the radiation projector optics can be reduced.

In addition, by providing that the photoresist coating system 71a operates in a stand alone manner with respect to the combined exposing/developing system 185, a break down of one system does not force a shut down of the other system. Moreover, a speed of one of the systems does not dictate a speed of the other system or systems. For example, if the combined exposing/developing system 185 can process wafers at twice the rate of the photoresist coating system 71, two photoresist coating systems may be used to provide that the combined exposing/developing system 185 may operate at full capacity.

Moreover, by providing an in-line coupling from the exposure stage 173b through the post exposure bake heater 171a to the developing track 183, a time between exposure and developing may be reduced and/or a uniformity of the time between exposure and developing may be improved. Accordingly, critical dimensions of the resulting patterned photoresist layers may be improved. In addition, operations of developing and/or exposing the photoresist may be adjusted to provide a match between the particular developing track 183 and exposure chamber 173 in the combined exposing/developing system 185.

Figure 3:
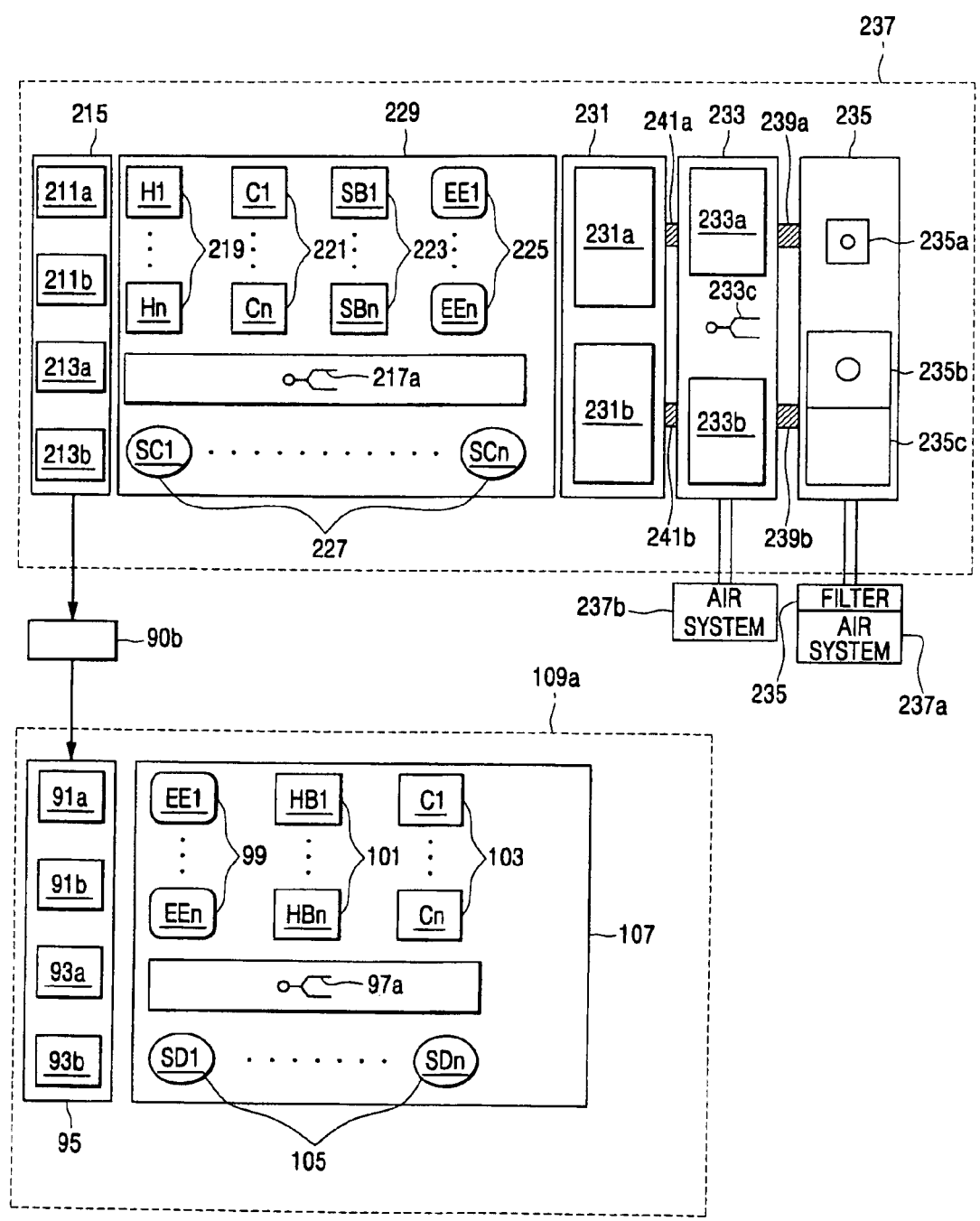
FIG. 3 is a block diagram illustrating photoresist coating systems and exposing/developing systems for photolithography according to third embodiments of the present invention.

FIG. 3 is a block diagram illustrating coating/exposing systems and developing systems according to third embodiments of the present invention. As shown in. FIG. 3, a combined coating/exposing system 237 may include an exposure chamber 235 providing a first isolated environment; an interface chamber 233 providing a second isolated environment; a staging chamber 231; a coating track 229; and a wafer handler that may include one or more robots 217a and/or 233c, and/or wafer cassette loading/unloading station 215. As further shown in FIG. 3, a photoresist developing system 109a may be provided separate from the combined coating/exposing system 237 with pluralities of wafers being transported from the combined coating/exposing system 237 to the developing system 109a in wafer cassettes. As will be understood by those having skill in the art, a wafer cassette is a container that may be configured to hold as many as 25 or more wafers in a configuration adapted for loading and unloading wafers using loading/unloading stations 215, and/or 95 without damaging the wafers. Moreover, cassettes of wafers may be transported from the combined coating/exposing system 237 to the developing system 109a, for example, manually, using automated guided vehicles (AGVs), using over head transport, and/or other techniques known to those having skill in the art. The photoresist developing system 109a and elements thereof function as discussed above with regard to the photoresist coating system 109 of FIG. 1, and discussion thereof will not be repeated.

The combined coating/developing system 237 is configured to coat wafers with photoresist, and then expose the coated wafers to an image projected thereon using electromagnetic radiation (such as light). More particularly, a pattern may be defined by opaque and transparent portions of a mask, and the pattern of the mask may be projected onto a wafer by projecting electromagnetic radiation through the mask to the wafer. The exposed photoresist may then be developed using the separate photoresist developing system 109a.

The wafer cassette loading/unloading station 215 may include a plurality of wafer unloading stations 211a-b and a plurality of wafer cassette loading stations 213a-b. The coating track 229 may include one or a plurality of spin coating units 227, one or a plurality of wafer handling robots 217a, one or a plurality of soft baking units 223 (such as a heating plate or plates), one or a plurality of adhesive coating units 219, one or a plurality of cooling units 221 (such as a cooling plate or plates), and/or one or a plurality of edge exposure units 225. In an alternative, edge exposure units may be omitted from the coating system and instead provided in the developing system The staging chamber 231 may include an input stage 213a and an output stage 231b, and the interface chamber 233 may include a post exposure baking heater 233a (such as a heating plate) and a cooler 233b (such as a cooling plate). The exposure chamber 235 may include a pre-alignment stage 235a, an exposure stage 235b, and a radiation projector 87c including a source of radiation (such as electromagnetic radiation) and a lens configured to focus exposing radiation from the source to a wafer on the exposure stage.

A wafer handler of the combined coating/developing system 237 may be configured to transfer each wafer from a cassette at an unloading station 211a-b prior to coating photoresist on the wafers and exposing the photoresist, and to load wafers into a wafer cassette at loading station 213a-b after coating and exposing the photoresist. In an alternative, a wafer may be returned to the same cassette from which it was removed. Moreover, the wafer handler of the combined coating/exposing system 237 may be configured to transfer wafers between different elements of the combined coating/exposing system. The wafer handler of the combined coating/exposing system 237 may include one or a plurality of robots such as robots 217a and/or 233c and/or alternate transfer mechanisms. In addition, belts may be provided at wafer unloading and/or loading stations 211a-b and/or 213a-b to unload wafers from and/or load wafers into wafer cassettes.

Operations of adhesive coating, photoresist spin coating, edge exposure, pattern exposure, and post exposure baking may be performed in-line such that each wafer is processed individually between unloading from a cassette at an unloading station 211a-b and loading into a cassette at a loading station 213a-b. As discussed above, wafer cassette transfer from the combined coating/exposing system 237 to the photoresist developing system 109a may be performed at block 90b, for example, manually, using AGVs, using overhead transport, etc. Accordingly, the photoresist developing system 109a may be operated in a stand-alone manner with respect to the combined coating/exposing system 237 of FIG. 3.

More particularly, a wafer cassette holding a plurality of wafers may be provided at one of the wafer unloading stations 211a-b, and the wafers in the cassette may be individually unloaded for photoresist coating on the coating track 229. Each individual wafer, for example, may be processed through an adhesive coating unit 219 to dispense an adhesive such as hexamethyldisilazane (HMDS) thereon to improve adhesion of a subsequently applied photoresist layer. The adhesive coating unit 219 may apply the adhesive by spinning the wafer while dispending a liquid adhesive thereon. After applying the adhesive, the wafer may be transferred to a cooling unit 221 (such as a cooling plate) and then to a photoresist spin coating unit 227 configured to dispense photoresist thereon by spinning the wafer while dispensing liquid photoresist thereon. After dispensing photoresist, the wafer may be transferred to a soft baking unit 223 (such as a baking plate) to remove solvents and thereby harden the photoresist by heating at a temperature in the range of approximately 100 degrees C. to approximately 110 degrees C. After soft baking, the wafer may be transferred to a cooling unit 221, and then to an edge exposure unit 225 to selectively expose portions of the hardened photoresist at edge portions of the wafer to radiation.

After edge exposure, a wafer may be transferred to the input stage 231a of the staging chamber 231. As shown in FIG. 3, a staging chamber 231 may include an input stage 231a and an output stage 231b; an interface chamber 233 may include a post exposure bake heater 233a (such as a baking plate) and a cooler 233b (such as a cooling plate); and an exposure chamber 235 may include a pre-alignment stage 235a, an exposure stage 235b, and a radiation projector 235c including a source of radiation (such as electromagnetic radiation) and a lens configured to focus exposing radiation from the source of radiation to a wafer on the exposure stage. In addition, the exposure chamber 235 may provide a first isolated environment including the pre-alignment stage 235a and the exposure stage 235b therein, and the interface chamber 233 may provide a second isolated environment including the post exposure bake heater 233a and the cooler 233b therein.

Moreover, separate air control systems 237a-b may be used to maintain desired conditions within the isolated environments of the exposure chamber 235 and the interface chamber 233. For example, the air control systems 237a-b may provide clean dry air to the respective chambers. In addition, the air control system 237a for the exposure chamber 235 may include a chemical filter 235 not used for the air supply to interface chamber 233. By providing the post exposure bake heater 233a outside the isolated environment of the exposure chamber 235, a lens and/or other optics of the radiation projector 235c may be protected from solvents and/or other contaminants that may be generated during post exposure baking. In addition, a lens and/or other optics of the radiation projector 235c may be insulated from heat generated by post exposure baking.

Exposure chamber input port 239a allows wafer transport from the second isolated environment of the interface chamber 233 to the first isolated environment of the exposure chamber 235. Exposure chamber output port 239b allows wafer transport from the first isolated environment of the exposure chamber 235 to the second isolated environment of the interface chamber 233. Moreover, the input and output ports 239a-b may include respective load/lock mechanisms to maintain isolation of the respective isolated environments of the interface and exposure chambers 233 and 235 when transferring wafers therebetween. The input and output ports 239a-b may also provide isolation of a wafer from an external environment during transport between the interface and exposure chambers 233 and 235.

By providing an in-line coupling(s) between the exposure stage 235b in the exposure chamber 235 and the post exposure bake heater 233a in the interface chamber 233, a time between exposure and post exposure bake for a wafer can be reduced thereby improving pattern uniformity. In addition, by providing isolated environments in the exposure and interface chambers 235 and 233, exposure to damaging chemicals such as ammonia may be reduced between exposure and post exposure bake. After post exposure bake, an exposed photoresist layer may be less susceptible to damage resulting from exposure to chemicals such as ammonia.

Interface chamber input port 241a allows wafer transport from the input stage 231a to the isolated environment of the interface chamber 233. Interface chamber output port 241b allows wafer transport from isolated environment of the interface chamber 233 to the output stage 231b. Moreover, the input and output ports 241a-b may include respective load/lock mechanisms to maintain isolation of the isolated environment of the interface chamber 233 when transferring wafers to and from the staging chamber 231. In an alternative, the input and output stages 231a-b may be included in the isolated environment of the interface chamber 233.

A cassette of wafers having photoresist thereon may thus be provided on one of the loading stations 211a-b, and a wafer handler of the combined exposing/developing system 237 may transport wafers from the cassette at the loading station for individual in-line processing through photoresist coating, exposure, and post exposure baking and then to another cassette at one of the unloading stations 213a-b. In an alternative, wafers may be returned to a same cassette from which they were removed after exposure and post exposure baking.

A wafer handler including robots 217a and/or 233c may remove a wafer having photoresist thereon from the cassette at the loading station, and transfer the wafer to the photoresist coating track 229. Within the coating track 229, the wafer handler may transfer the wafer to an adhesive coating unit 219 to dispense an adhesive (such as HMDS) thereon; to a spin coating unit 227 to dispense a layer of photoresist thereon; to a soft bake unit 223 to bake the layer of photoresist; and to an edge exposure unit 225 to expose portions of the photoresist on edge portions of the wafer. On completion of operations of the photoresist coating track 229, the wafer handler may transfer the wafer to the input stage 231a.

From the input stage 231a, the wafer handler may then transfer the wafer through input port 241a into the interface chamber 233 and then through input port 239a to a pre-alignment stage 235a in the exposure chamber 235. The pre-alignment stage 235a may provide physical alignment of the wafer before transferring the wafer to the exposure stage 235b. At the exposure stage 235b, the photoresist layer on the wafer is exposed to electromagnetic radiation generated by the radiation projector 235c. Exposure operations are also discussed, for example, in U.S. Patent Publication No. 2002/0011207, the disclosure of which is hereby incorporated herein in its entirety by reference.

After exposure, the wafer handler may transfer the wafer from the exposure stage 235b through the output port 239b to the post exposure bake heater 233a in the interface chamber 233. More particularly, the post exposure bake heater 233a may be configured to heat the wafer and photoresist thereon to a temperature in the range of approximately 100 degrees C. to approximately 110 degrees C. By heating the exposed photoresist, an interface profile between the exposed and non-exposed regions of the photoresist layer may be improved by more uniformly diffusing acid in exposed regions. The post exposure baking may also reduce subsequent damage to the exposed photoresist layer resulting from exposure to ammonia.

After post exposure baking, the wafer handler may transfer the wafer to the cooler 233b for cooling. After cooling, the wafer handler may transfer the wafer from the cooler 233b, through the output port 241b to the output stage 231b. From the output stage 231b, the wafer may be transferred to a cassette on one of the loading stations 213a-b. More particularly, the exposed wafer may be transferred from the output stage 231b to a loading station 213a-b using a robot 217a of the photoresist developing track 229 without performing any coating operations on the exposed wafer.

The operations of dispensing adhesive, spin coating photoresist, pre-alignment, exposure, and post exposure baking may be performed in-line such that each wafer is processed individually between unloading from a cassette at an unloading station 211a-b and loading into a cassette at a loading station 213a-b. Wafer cassette transfer from the combined exposing/developing system 237 to the photoresist developing system 109a may be performed at block 90b, for example, manually, using AGVs, using overhead transport, etc. Accordingly, the photoresist developing system 109a may be operated in a stand-alone manner with respect to the combined coating/exposing system 237 of FIG. 3.

By providing an in-line coupling between the exposure stage 235b and the post exposure bake heater 233a, a time between exposure and post exposure baking can be reduced. By providing protection from an external environment in the exposure chamber 235, in the output port 239b, and in the interface chamber 233 during and between exposure and post exposure baking, deterioration due to exposure to agents such as ammonia can be reduced.

The photoresist developing system 109a and elements thereof function as discussed above with respect to the photoresist developing system 109 of FIG. 1, and discussion thereof will not be repeated. As shown in FIG. 3, each of the photoresist coating track 229 and the photoresist developing system 109a includes an edge exposure unit 225 and 99. As will be understood, however, an edge exposure unit may be provided in one of the coating track or the developing systems and omitted in the other. Moreover, the photoresist developing system 109a may be operated in a stand-alone manner with respect to the combined exposing/developing system 237 of FIG. 3.

By providing an in-line coupling between the exposure stage 235b and the post exposure bake heater 233a, a time between exposure and post exposure bake can be reduced thereby reducing deterioration of the exposed photoresist. After baking, the photoresist is less susceptible to deterioration. Deterioration can be further reduced by providing that the photoresist is isolated from an outside environment during and between exposure and post exposure baking. By maintaining the post exposure bake heater outside an isolated environment including the radiation projector 235c, contamination of the radiation projector optics (due to solvents released during post exposure bake) can be reduced, and thermal expansion of the radiation projector optics can be reduced.

In addition, by providing that the photoresist developing system 109a operates in a stand alone manner with respect to the combined coating/exposing system 237, a break down of one system does not force a shut down of the other. Moreover, a speed of one of the systems does not dictate a speed of the other system. For example, if the combined coating/exposing system 237 can process wafers at twice the rate of the photoresist developing system 109a, two photoresist developing systems may be used to provide that the combined coating/exposing system 237 may operate at full capacity.

Moreover, by providing an in-line coupling from the coating track 229 through the exposure stage 235b to the post exposure bake heater 233a, a time between coating, exposing, and post exposure baking may be reduced and/or a uniformity of time between coating, exposing, and post exposure baking may be improved. Accordingly, a uniformity of thickness of the resulting photoresist may be improved. In addition, exposure operations of the exposure chamber 235 may be tuned to particular characteristic of the photoresist coating track 229 coupled thereto.

While the present invention has been particularly shown and described with reference to embodiments thereof, it will be understood by those skilled in the art that various changes in form and details may be made therein without departing That which is claimed is:

1. A system for photolithography comprising;
an exposure chamber providing an isolated environment;
an exposure stage in the isolated environment of the exposure chamber, the exposure stage being configured to receive a wafer having photoresist thereon to be exposed;
a radiation source configured to provide radiation to the wafer being exposed;
an interface chamber outside the isolated environment of the exposure chamber;
a port allowing wafer transport between the isolated environment of the exposure chamber and the interface chamber;
a post exposure bake heater in the interface chamber, the post exposure bake heater being configured to bake the wafer after exposure; and
a wafer handler configured to remove the wafer having photoresist thereon from a cassette holding a plurality of wafers having photoresist thereon, to move the wafer having photoresist thereon through the port to the isolated environment of the exposure chamber before exposure, to remove the wafer through the port from the isolated environment of the exposure chamber after exposure, to move the wafer to the post exposure bake heater after removing the wafer from the exposure chamber, and to move the wafer to the cassette or a different cassette after baking the wafer without developing the photoresist on the wafer.

2. A system according to claim 1 wherein the wafer handler is configured to return the wafer to the cassette from which the wafer was removed after baking the wafer without developing the photoresist on the wafer.

3. A system according to claim 1 wherein the wafer handler is configured to move the wafer to the different cassette after baking the wafer without developing the photoresist on the wafer.

4. A system according to claim 1 wherein the interface chamber provides a second isolated environment separate from the first isolated environment of the exposure chamber with the port allowing wafer transport between the first and second isolated environments, wherein the post exposure bake heater is in the second isolated environment of the interface chamber wherein the first and second isolated environments are isolated from each other.

5. A system according to claim 4 wherein a photoresist coating unit and a photoresist developing unit are outside the first and second isolated environments of the exposure and interface chambers.

6. A system according to claim 4 wherein the first isolated environment of the exposure chamber is configured to receive air from a first source, wherein the second isolated environment of the interface chamber is configured to receive air from a second source, and wherein the first and second sources are different.

7. A system according to claim 6 wherein the first source comprises a filter not included in the second source.

8. A system according to claim 1 further comprising:
a photoresist coating unit configured to coat a layer of photoresist on the wafer and to load the wafer in the cassette holding the plurality of wafers having photoresist thereon before removing the wafer from the cassette at the wafer handler.

9. A system according to claim 1 further comprising:
a photoresist developing unit configured to develop exposed photoresist on the wafer after moving the wafer to the cassette or to the different cassette.

10. A system according to claim 1 wherein the port includes a load/lock mechanism to maintain isolation of the isolated environment of the exposure chamber when transporting the wafer between the isolated environment of the exposure chamber and the interface chamber.

11. A system according to claim 1 wherein the port includes a first port allowing transport of the wafer from the interface chamber to the isolated environment of the exposure chamber and a second port allowing transport of the wafer from the isolated environment of the exposure chamber to the interface chamber.

12. A system according to claim 1 wherein the wafer is individually processed between removing the wafer from the cassette and moving the wafer to the cassette or the different cassette to provide in-line processing through exposure and post exposure baking.

13. A system according to claim 1 further comprising:
a cooler configured to cool the wafer after baking wherein the wafer handler is further configured to move the wafer to the cooler after baking and to move the wafer to the cassette or the different cassette after cooling.

14. A system according to claim 1 wherein the wafer handler comprises an in-line wafer handler.

15. A system for photolithography comprising:
an exposure chamber providing an isolated environment;
an exposure stage in the isolated environment of the exposure chamber, the exposure stage being configured to receive a wafer having photoresist thereon to be exposed;
a radiation source configured to provide exposing radiation to the wafer being exposed;
a port allowing wafer transport into and out of the isolated environment of the exposure chamber;
a post exposure bake heater configured to bake the wafer after exposure;
a photoresist developing unit configured to dispense a developer on the wafer after exposing and baking; and
a wafer handler configured to remove the wafer having photoresist thereon from a cassette holding a plurality of wafers having photoresist thereon, to move the wafer through the port to the isolated environment of the exposure chamber after removing the wafer from the cassette, to remove the wafer through the port from the isolated environment of the exposure chamber after exposure, to move the wafer to the post exposure bake heater after removing the wafer from the exposure chamber, and to move the wafer to the developing station so that the developer is dispensed on the wafer after baking.

16. A system according to claim 15 wherein the wafer handler is further configured to place the wafer in the cassette from which the wafer was removed after dispensing developer on the wafer.

17. A system according to claim 15 wherein the wafer handler is further configured to place the wafer in a different cassette other than the cassette from which the wafer was removed after dispensing developer on the wafer.

18. A system according to claim 15 further comprising:
an interface chamber outside the first isolated environment of the exposure chamber, wherein the interface chamber provides a second isolated environment separate from the first isolated environment with the port allowing wafer transport between the first and second isolated environments and wherein the post exposure bake heater is in the second isolated environment of the interface chamber wherein the first and second isolated environments are isolated from each other.

19. A system according to claim 18 wherein the photoresist developing unit is in the second isolated environment of the interface chamber.

20. A system according to claim 18 wherein the photoresist developing unit is outside the second isolated environment of the interface chamber.

21. A system according to claim 18 wherein a photoresist coating unit is outside the first and second isolated environments.

22. A system according to claim 18 wherein the first isolated environment is configured to receive air from a first source, wherein the second isolated environment is configured to receive air from a second source, and wherein the first and second sources are different.

23. A system according to claim 22 wherein the first source comprises a filter not included in the second source.

24. A system according to claim 15 further comprising:
a photoresist coating unit configured to coat a layer of photoresist on the wafer and to load the wafer in the cassette holding the plurality of wafers having photoresist thereon before removing the wafer from the cassette at the wafer handler.

25. A system according to claim 15 wherein the port includes a load/lock mechanism to maintain isolation of the isolated environment of the exposure chamber when transporting the wafer into and out of the isolated environment of the exposure chamber.

26. A system according to claim 15 wherein the port includes a first port allowing transport of the wafer into the isolated environment of the exposure chamber and a second port allow transport of the wafer out of the isolated environment of the exposure chamber.

27. A system according to claim 15 wherein the wafer is individually processed from removing the wafer from the cassette until after dispensing developer on the wafer to provide in-line processing through exposure, post exposure baking, and developing.

28. A system according to claim 15 further comprising:
a cooler configured to cool the wafer after baking wherein the wafer handler is further configured to move the wafer to the cooler after baking and to move the wafer to the developing station after cooling.

29. A system according to claim 15 wherein the wafer handler comprises an in-line wafer handler.

30. A system for photolithography comprising:
a photoresist coating unit configured to dispense photoresist on a wafer;
an exposure chamber providing an isolated environment;
an exposure stage in the isolated environment of the exposure chamber, the exposure stage being configured to receive the wafer having photoresist thereon to be exposed;
a radiation source configured to provide exposing radiation to the wafer being exposed;
a port allowing wafer transport into and out of the isolated environment of the exposure chamber;
a post exposure bake heater configured to bake the wafer after exposure; and
a wafer handler configured to move the wafer to the photoresist coating unit, to move the wafer through the port to the isolated environment of the exposure chamber after dispensing photoresist thereon, to remove the wafer from the isolated environment of the exposure chamber through the port after exposure, to move the wafer to the post exposure bake heater after removing the wafer from the exposure chamber, and to move the wafer to a cassette holding a plurality of wafers after baking without developing the photoresist on the wafer.

31. A system according to claim 30 wherein the wafer handler is further configured to remove the wafer from a cassette holding a plurality of wafers before moving the wafer to the photoresist coating unit wherein the wafer is removed from and moved to the same cassette.

32. A system according to claim 30 wherein the wafer handler is further configured to remove the wafer from a cassette holding a plurality of wafers before moving the wafer to the photoresist coating unit wherein the wafer is removed from and moved to different cassettes.

33. A system according to claim 30 further comprising:
an interface chamber outside the first isolated environment of the exposure chamber, wherein the interface chamber provides a second isolated environment separate from the first isolated environment with the port allowing wafer transport between the first and second isolated environments and wherein the post exposure bake heater is in the second isolated environment of the interface chamber wherein the first and second environments are isolated from each other.

34. A system according to claim 33 wherein the photoresist coating unit is in the second isolated environment of the interface chamber.

35. A system according to claim 33 wherein the photoresist coating unit is outside the first and second isolated environments.

36. A system according to claim 33 wherein a photoresist developing unit is outside the first and second isolated environments.

37. A system according to claim 33 wherein the first isolated environment is configured to receive air from a first source, wherein the second isolated environment is configured to receive air from a second source, and wherein the first and second sources are different.

38. A system according to claim 37 wherein the first source comprises a filter not included in the second source.

39. A system according to claim 30 further comprising:
a photoresist developing unit configured to dispense a developer on the wafer after moving the wafer to the cassette.

40. A system according to claim 30 wherein the port includes a load/lock mechanism to maintain isolation of the isolated environment of the exposure chamber when transporting the wafer into and out of the isolated environment of the exposure chamber.

41. A system according to claim 30 wherein the port includes a first port allowing transport of the wafer into the isolated environment of the exposure chamber and a second port allowing transport of the wafer out of the isolated environment of the exposure chamber.

42. A system according to claim 30 wherein the wafer is individually processed from moving the wafer to the photoresist coating unit until moving the wafer to the cassette to provide in-line processing through coating, exposure, and post exposure baking.

43. A system according to claim 30 wherein the wafer handler comprises an in-line wafer handler.

44. A system according to claim 30 further comprising:
a cooler configured to cool the wafer after post exposure baking wherein the wafer handler is further configured to move the wafer to the cooler after post exposure baking and to move the wafer to cassette after cooling.

45. A system for photolithography comprising;
an exposure chamber providing a first isolated environment:
an exposure stage in the first isolated environment of the exposure chamber, the exposure stage being configured to receive a wafer having photoresist thereon to be exposed;
a radiation source configured to provide exposing radiation to the wafer being exposed;
an interface chamber providing a second isolated environment, wherein the first and second isolated environments are isolated from each other;
a port allowing wafer transport between the first and second isolated environments of the exposure and interface chambers;
a post exposure bake heater in the second isolated environment of the interface chamber, the post exposure bake heater being configured to bake the wafer after exposure; and
a wafer handler configured move the wafer from the interface chamber through the port into the exposure chamber before exposure, to move the wafer from the exposure chamber through the port to the interface chamber after exposure, and to move the wafer to the post exposure bake heater after moving the wafer from the exposure chamber;
wherein at least one of a photoresist coating unit and/or a photoresist developing unit is excluded from the first and second isolated environments of the exposure and interface chambers.

46. A photolithography system according to claim 45 further comprising:
a photoresist coating unit configured to coat a layer of photoresist on the wafer and to load the wafer in a cassette holding a plurality of wafers having photoresist thereon, wherein the photoresist coating unit is outside the first and second isolated environments of the exposure and interface chambers, and wherein the wafer handler is further configured to remove the wafer having photoresist thereof from the cassette before moving the wafer into the exposure chamber.

47. A photolithography system according to claim 45 wherein the wafer handler is further configured to move the wafer to a cassette holding a plurality of wafers after post exposure baking, the system further comprising:
a photoresist developing unit configured to dispense developer on the wafer after moving the wafer to the cassette wherein the photoresist developing unit is outside the first and second isolated environments of the exposure and interface chambers.

48. A system according to claim 45 wherein the wafer handler is further configured to remove the wafer having photoresist thereon from a cassette holding a plurality of wafers having photoresist thereon before moving the wafer to the exposure chamber.

49. A system according to claim 45 wherein the wafer handler is further configured to move the wafer to a cassette after post exposure baking without developing.

50. A system according to claim 45 wherein the isolated environment of the exposure chamber is further configured to receive air from a first source, wherein the isolated environment of the interface chamber is further configured to receive air from a second source, and wherein the first and second sources are different.

51. A system according to claim 50 wherein the first source comprises a filter not included in the second source.

52. A system according to claim 45 wherein the port includes a load/lock mechanism to maintain isolation of the first and second isolated environments of the exposure and interface chambers when transporting the wafer between the first and second isolated environments.

53. A system according to claim 45 wherein the port includes a first port allowing transport of the wafer from the interface chamber to the exposure chamber and a second port allowing transport of the wafer from the exposure chamber to the interface chamber.

54. A system according to claim 45 wherein the wafer is individually processed to provide in-line processing through exposure and post exposure baking.

55. A system according to claim 45 wherein the wafer handler comprises an in-line wafer handler.

56. A method of patterning photoresist on an integrated circuit wafer, the method comprising:
removing a wafer having photoresist thereon from a cassette holding a plurality of wafers having photoresist thereon,
after removing the wafer from the cassette, moving the wafer having photoresist thereon to an isolated environment of an exposure chamber;
after moving the wafer to the exposure chamber, exposing portions of the photoresist on the wafer to radiation;
after exposing portions of the photoresist on the wafer to radiation, moving the wafer from the isolated environment of the exposure chamber to a post exposure bake heater outside the isolated environment of the exposure chamber;
after moving the wafer to the post exposure bake heater, post exposure baking the wafer; and
after baking the wafer, moving the wafer to the cassette or a different cassette after baking the wafer without developing the photoresist on the wafer.

57. A method according to claim 56 wherein moving the wafer to the cassette or a different cassette comprises returning the wafer to the cassette from which the wafer was removed.

58. A method according to claim 56 wherein moving the wafer to the cassette or a different cassette comprises move the wafer to the different cassette.

59. A method according to claim 56 wherein the post exposure bake heater is provided in a second isolated environment separate from the first isolated environment of the exposure chamber with a port allowing wafer transport between the first and second isolated environments wherein the first and second isolated environments are isolated from each other.

60. A method according to claim 56 wherein the wafer is individually processed between removing the wafer from the cassette and moving the wafer to the cassette or the different cassette to provide in-line processing through exposing and post exposure baking.

61. A method of patterning photoresist on an integrated circuit wafer, the method comprising:
removing a wafer having photoresist thereon from a cassette holding a plurality of wafers having photoresist thereon;
after removing the wafer from the cassette, moving the wafer to an isolated environment of an exposure chamber;
after moving the wafer to the isolated environment of the exposure chamber, exposing portions of the photoresist on the wafer to radiation;
after exposing portions of the photoresist on the wafer to radiation, moving the wafer from the isolated environment of the exposure chamber to a post exposure bake heater outside the isolated environment of the exposure chamber;

after moving the wafer to the post exposure bake heater, post exposure baking the wafer; and after post exposure baking the wafer, moving the wafer from the post exposure bake heater and dispensing developer on the wafer.

62. A method according to claim 61 further comprising:

after dispensing developer, moving the wafer to the cassette from which the wafer was removed.

63. A method according to claim 61 further comprising:

after dispensing developer, moving the wafer to a different cassette other than the cassette from which the wafer was removed.

64. A method according to claim 61 wherein the wafer is individually processed from removing the wafer from the cassette until after dispensing developer on the wafer to provide in-line processing through exposure, post exposure baking, and developing.

65. A method of patterning photoresist on an integrated circuit wafer, the method comprising:

dispensing photoresist on the wafer;

after dispensing photoresist on the wafer, moving the wafer to an isolated environment of an exposure chamber;

after moving the wafer to the isolated environment of the exposure chamber, exposing portions of the photoresist on the wafer to radiation;

after exposing portions of the photoresist on the wafer to radiation, moving the wafer from the isolated environment of the exposure chamber to a post exposure bake heater outside the isolated environment of the exposure chamber;

after moving the wafer to the post exposure bake heater, post exposure baking the wafer; and after post exposure baking the wafer, moving the wafer to a cassette holding a plurality of wafers after baking without developing the photoresist on the wafer.

66. A method according to claim 65 further comprising:

before dispensing photoresist on the wafer, removing the wafer from a cassette holding a plurality of wafers wherein the wafer is removed from and moved to the same cassette.

67. A method according to claim 65 further comprising:

before dispensing photoresist on the wafer, removing the wafer from a cassette holding a plurality of wafers wherein the wafer is removed from and moved to different cassettes.

68. A method according to claim 65 wherein the wafer is individually processed from dispensing photoresist on the wafer until moving the wafer to the cassette to provide in-line processing through dispensing, exposing, and post exposure baking.

* * * * *